(12) United States Patent
Lajoie et al.

(10) Patent No.: US 11,393,927 B2
(45) Date of Patent: Jul. 19, 2022

(54) MEMORY CELLS BASED ON THIN-FILM TRANSISTORS

(71) Applicant: Intel Corporation, Santa Clara, CA (US)

(72) Inventors: Travis W. Lajoie, Forest Grove, OR (US); Abhishek Sharma, Hillsboro, OR (US); Van H. Le, Portland, OR (US); Chieh-Jen Ku, Hillsboro, OR (US); Pei-Hua Wang, Beaverton, OR (US); Jack T. Kavalieros, Portland, OR (US); Bernhard Sell, Portland, OR (US); Tahir Ghani, Portland, OR (US); Juan Alzate Vinasco, Tigard, OR (US)

(73) Assignee: Intel Coropration, Santa Clara, CA (US)

( * ) Notice: Subject to any disclaimer, the term of this patent is extended or adjusted under 35 U.S.C. 154(b) by 785 days.

(21) Appl. No.: 16/142,300

(22) Filed: Sep. 26, 2018

(65) Prior Publication Data
US 2020/0098932 A1 Mar. 26, 2020

(51) Int. Cl.
*H01L 29/78* (2006.01)
*H01L 29/786* (2006.01)
(Continued)

(52) U.S. Cl.
CPC .... *H01L 29/78642* (2013.01); *H01L 27/1082* (2013.01); *H01L 27/10858* (2013.01);
(Continued)

(58) Field of Classification Search
CPC ........... H01L 29/78642; H01L 27/1082; H01L 27/10858; H01L 27/10873; H01L 29/4908; H01L 29/66969; H01L 29/78663; H01L 29/78672; H01L 29/78681; H01L 29/78684; H01L 29/7869; H01L 29/78693; H01L 29/78696; H01L 27/1225; H01L 27/1255; H01L 29/1606; H01L 29/7788
See application file for complete search history.

(56) References Cited

U.S. PATENT DOCUMENTS 9,842,839 B1 * 12/2017 Sills .................. H01L 21/31144
9,935,114 B1 * 4/2018 Chavan ............. H01L 27/11507
(Continued)

*Primary Examiner* — Shouxiang Hu
(74) *Attorney, Agent, or Firm* — Schwabe, Williamson & Wyatt, P.C.

(57) ABSTRACT

Embodiments herein describe techniques for a semiconductor device including a capacitor and a transistor above the capacitor. A contact electrode may be shared between the capacitor and the transistor. The capacitor includes a first plate above a substrate, and the shared contact electrode above the first plate and separated from the first plate by a capacitor dielectric layer, where the shared contact electrode acts as a second plate for the capacitor. The transistor includes a gate electrode above the substrate and above the capacitor; a channel layer separated from the gate electrode by a gate dielectric layer, and in contact with the shared contact electrode; and a source electrode above the channel layer, separated from the gate electrode by the gate dielectric layer, and in contact with the channel layer. The shared contact electrode acts as a drain electrode of the transistor. Other embodiments may be described and/or claimed.

19 Claims, 8 Drawing Sheets

(51) Int. Cl.
*H01L 29/66* (2006.01)
*H01L 27/108* (2006.01)
*H01L 29/49* (2006.01)

(52) U.S. Cl.
CPC .... *H01L 27/10873* (2013.01); *H01L 29/4908* (2013.01); *H01L 29/66969* (2013.01); *H01L 29/7869* (2013.01); *H01L 29/78663* (2013.01); *H01L 29/78672* (2013.01); *H01L 29/78681* (2013.01); *H01L 29/78684* (2013.01); *H01L 29/78693* (2013.01); *H01L 29/78696* (2013.01)

(56) References Cited

U.S. PATENT DOCUMENTS 10,872,650 B2 * 12/2020 Derner .................... H01L 28/55
11,264,512 B2 * 3/2022 Dewey .............. H01L 29/78618

* cited by examiner

MEMORY CELLS BASED ON THIN-FILM TRANSISTORS

FIELD

Embodiments of the present disclosure generally relate to the field of integrated circuits, and more particularly, to memory arrays.

BACKGROUND

A thin-film transistor (TFT) is a kind of field-effect transistor including a channel layer, a gate electrode, and source and drain electrodes, over a supporting but non-conducting substrate. A TFT differs from a conventional transistor, where a channel of the conventional transistor is typically within a substrate, such as a silicon substrate. TFTs have emerged as an attractive option to fuel Moore's law by integrating TFTs vertically in the backend, while leaving the silicon substrate areas for high-speed transistors. TFTs hold great potential for large area and flexible electronics, e.g., displays. Other applications of TFTs may include memory arrays. However, memory cells of a memory array based on TFTs may suffer from large capacitance.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
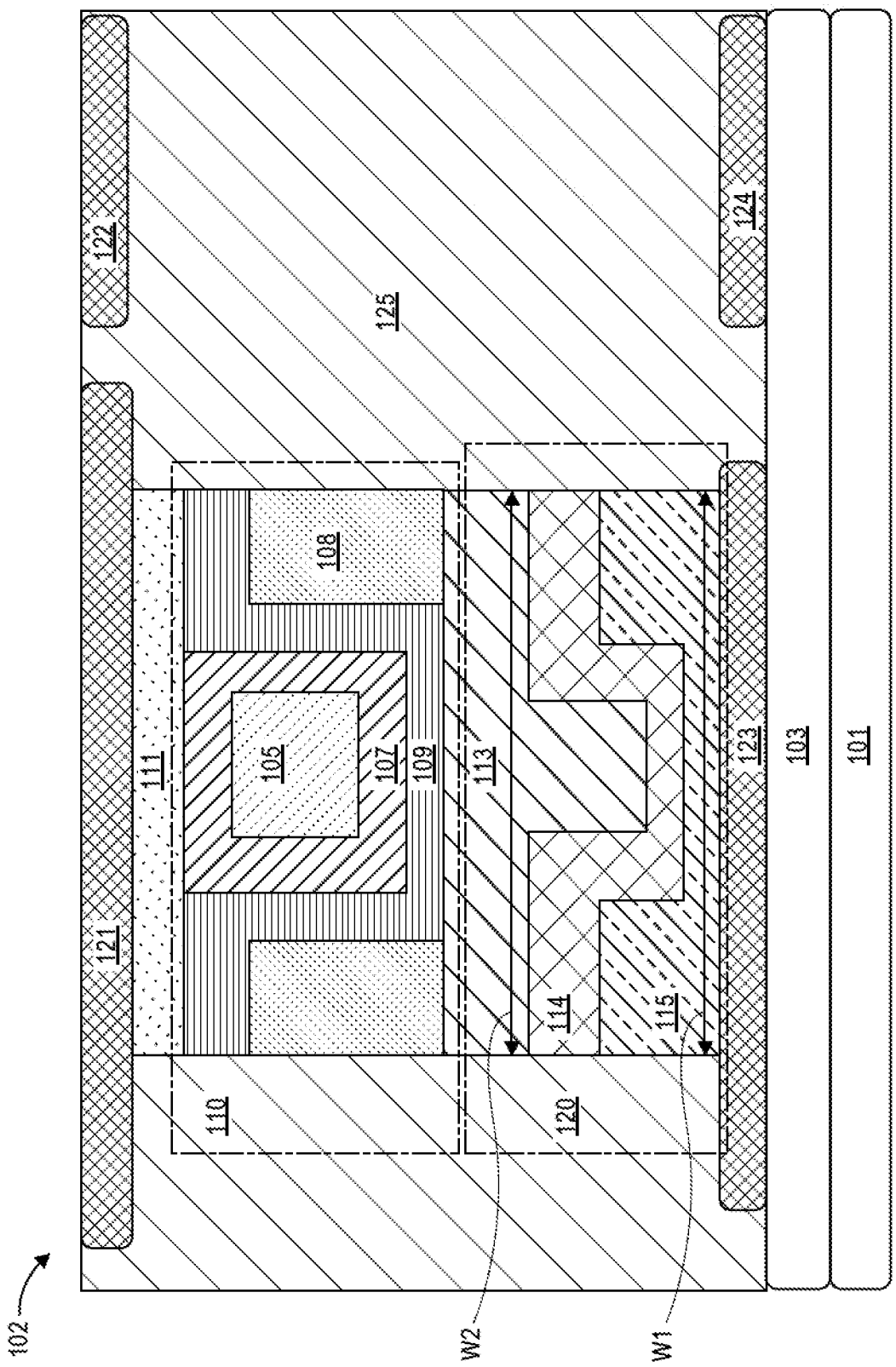
FIGS. 1(a)-1(b) schematically illustrate diagrams of memory cells including a thin-film transistor (TFT) and a capacitor with a shared contact electrode, in accordance with some embodiments.

Thin-film transistors (TFT) have emerged as an attractive option to fuel Moore's law by integrating TFTs in the backend for various applications such as memory arrays. A memory array, e.g., a dynamic random access memory (DRAM), may include a plurality of memory cells, wherein a memory cell may include a selector, e.g., a transistor, to control the access to a storage cell. In embodiments, the storage cell may be a capacitor to store charge, resulting in a 1T1C (one transistor, one capacitor) architecture for the memory cell. When a normal silicon transistor is used as a selector for a memory cell, the transistor may be very leaky, so that the charge stored in a storage cell may not be retained for long due to leakage caused by the transistor. A TFT may be used as a selector of a memory cell in a memory array with improved performance compared to a normal silicon transistor.

However, an 1T1C memory cell may suffer from misalignment between the TFT and the capacitor during patterning. Performance may be degraded due to increased capacitance caused by the misalignments. Embodiments herein may present a memory cell including a TFT and a capacitor with a shared contact electrode, where the TFT and the capacitor may be self-aligned. In addition, the capacitor may be formed first and under the TFT to reduce capacitance variation and degradation of the TFT that may be caused if the capacitor is formed after the formation of the TFT. TFTs may be fabricated in various architectures, e.g., a back-gated or bottom gate architecture, a top-gate architecture, or a vertical architecture. Memory cells herein may include a TFT with a vertical architecture.

Embodiments herein may present a semiconductor device including a substrate, an inter-level dielectric (ILD) layer above the substrate, a capacitor within the ILD layer, and a transistor within the ILD layer and above the capacitor. A contact electrode may be shared between the capacitor and the transistor. The capacitor includes a first plate above the substrate, and the shared contact electrode above the first plate and separated from the first plate by a capacitor dielectric layer, where the shared contact electrode acts as a second plate for the capacitor. The transistor includes a gate electrode above the substrate and above the capacitor; a channel layer including a channel material, separated from the gate electrode by a gate dielectric layer, and in contact with the shared contact electrode; and a source electrode above the channel layer, separated from the gate electrode by the gate dielectric layer, and in contact with the channel layer. The shared contact electrode acts as a drain electrode of the transistor.

Embodiments herein may present a method for forming a semiconductor device. The method may include: forming a first plate of a capacitor within an ILD layer above a substrate; depositing a capacitor dielectric layer adjacent to the first plate; and forming a shared contact electrode above the first plate and separated from the first plate by the capacitor dielectric layer. The shared contact electrode acts as a second plate for the capacitor. In addition, the method includes: forming a channel layer including a channel material, the channel layer in contact with the shared contact electrode that acts as a drain electrode of a transistor; forming a gate dielectric layer adjacent to the channel layer; forming a gate electrode adjacent to the gate dielectric layer and separated from the channel layer by the gate dielectric layer; and forming a source electrode above the channel layer, separated from the gate electrode by the gate dielectric layer, and in contact with the channel layer.

Embodiments herein may present a computing device, which may include a circuit board, and a memory device coupled to the circuit board and including a memory array. In more detail, the memory array may include a plurality of memory cells. A memory cell of the plurality of memory cells may include a transistor and a capacitor. The capacitor includes a first plate above a substrate and coupled to a bit line of the memory array, and a shared contact electrode above the first plate and separated from the first plate by a capacitor dielectric layer, where the shared contact electrode acts as a second plate for the capacitor. The transistor includes a gate electrode above the capacitor and coupled to a word line of the memory array; a channel layer including a channel material, separated from the gate electrode by a gate dielectric layer, and in contact with the shared contact electrode; and a source electrode above the channel layer, separated from the gate electrode by the gate dielectric layer, in contact with the channel layer, and coupled to a source line of the memory array. The shared contact electrode acts as a drain electrode of the transistor.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1B:
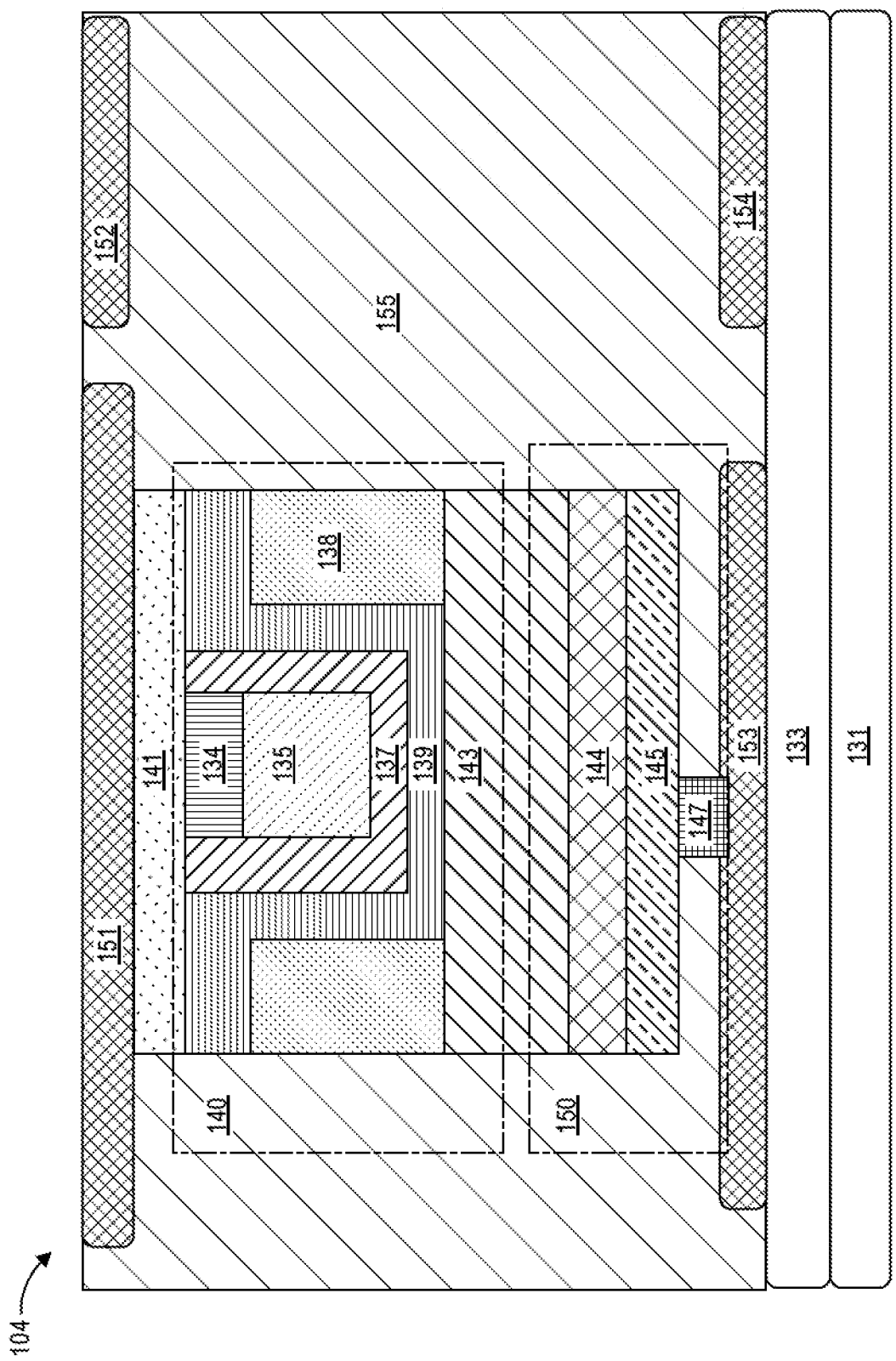

FIGS. 1(a)-1(b) schematically illustrate diagrams of memory cells including a TFT and a capacitor with a shared contact electrode, e.g., a memory cell 102 including a TFT 110 and a capacitor 120 with a shared contact electrode 113, or a memory cell 104 including a TFT 140 and a capacitor 150 with a shared contact electrode 143, in accordance with some embodiments. For clarity, features of the memory cell 102, the memory cell 104, the TFT 110, the TFT 140, the capacitor 120, the capacitor 150, the shared contact electrode 113, and the shared contact electrode 143, may be described below as examples for understanding an example memory cell including a TFT and a capacitor with a shared contact electrode. It is to be understood that there may be more or fewer components within a memory cell, a TFT, a capacitor, and a shared contact electrode. Further, it is to be understood that one or more of the components within a memory cell, a TFT, a capacitor, and a shared contact electrode, may include additional and/or varying features from the description below, and may include any device that one having ordinary skill in the art would consider and/or refer to as a memory cell, a TFT, a capacitor, and a shared contact electrode.

In embodiments, the memory cell 102 includes a substrate 101, an ILD layer 103 above the substrate 101, and an ILD layer 125 above the ILD layer 103. The capacitor 120 and the TFT 110 above the capacitor 120 are formed within the ILD layer 125. The shared contact electrode 113 may be a drain electrode of the TFT 110 as well as a plate of the capacitor 120. The TFT 110 and the capacitor 120 are self-aligned that a shadow of the TFT 110 substantially overlaps with the capacitor 120.

In embodiments, the capacitor 120 includes a first plate 115, and the shared contact electrode 113 above the first plate 115 and separated from the first plate 115 by a capacitor dielectric layer 114. The first plate 115 may have a width W1, and the shared contact electrode 113 may have a width W2, which may be substantially same to the width W1. The capacitor dielectric layer 114, the first plate 115, or the shared contact electrode 113 may include a U-shaped portion, which may increase the area of the plate. In some other embodiments, the capacitor dielectric layer 114, the first plate 115, or the shared contact electrode 113 may be of a rectangular shape in parallel to each other, as shown in FIG. 1(b).

In embodiments, the TFT 110 includes a gate electrode 105, a channel layer 109 including a channel material, where the channel layer 109 is separated from the gate electrode 105 by a gate dielectric layer 107. The channel layer 109 is in contact with the shared contact electrode 113. The TFT 110 further includes a source electrode 111 above the channel layer 109, separated from the gate electrode 105 by the gate dielectric layer 107, and in contact with the channel layer 109. A passivation layer 108 is around the channel layer 109 and the shared contact electrode 113.

In embodiments, the substrate 101 may be oriented in a horizontal direction. The gate electrode 105 may be above the substrate 101, oriented in a vertical direction substantially orthogonal to the horizontal direction. In detail, the gate electrode 105 oriented in the vertical direction may mean that the gate electrode 105 is oriented in a vertical direction substantially perpendicular or orthogonal to the plane defined by the substrate 101 that is oriented in the horizontal direction. A first direction may be substantially perpendicular or orthogonal to a second direction when there is +/−10 degrees of orthogonality between the two directions. For example, the substrate 101 may be in the horizontal direction, while the gate electrode 105 may be oriented in a vertical direction above the substrate 101 when the gate electrode 105 may form 80 degree or 100 degree with the horizontal direction.

In embodiments, the gate dielectric layer 107 includes a gate dielectric material, and is oriented in the vertical direction, around the gate electrode 105, and above the substrate 101. The gate dielectric layer 107 may be completely around the gate electrode 105 as shown in FIG. 1, or partially around the gate electrode 105. The channel layer 109 includes a channel material, and is oriented in the vertical direction, around the gate dielectric layer 107, and above the substrate 101. The source electrode 111 is above the channel layer 109, the gate dielectric layer 107, separated from the gate electrode 105 by the gate dielectric layer 107, and in contact with a first portion of the channel layer 109. The first portion may be a source area of the channel layer 109. The shared contact electrode 113 is below the channel layer 109, separated from the gate electrode 105, and in contact with a second portion of the channel layer 109. The second portion may be a drain area of the channel layer 109. The source electrode 111 and the drain electrode 113 may be interchangeable. For example, the source electrode 111 may be below the channel layer 109, and the drain electrode 113 may be above the channel layer 109.

In embodiments, the source electrode 111 is coupled to a metal electrode 121, the first plate 115 of the capacitor 120 is coupled to a metal electrode 123. The metal electrode 121 is located in a first metal layer 122, and the metal electrode 123 is located in a second metal layer 124, and the second metal layer 124 is separated from the first metal layer 122 by the ILD layer 125. In embodiments, the memory cell 102 may be a memory cell of a memory array. The gate electrode 105 may be coupled to a word line of a memory array, the first plate 115 of the capacitor 120 may be coupled to a bit line of the memory array, and the source electrode 111 may be coupled to a source line of the memory array.

In embodiments, the gate electrode 105, the source electrode 111, the first plate 115, or the shared contact electrode 113 may include titanium (Ti), molybdenum (Mo), gold (Au), platinum (Pt), aluminum (Al), nickel (Ni), copper (Cu), chromium (Cr), hafnium (Hf), indium (In), Mg, W, Fe, Vn, Zn, Ta, Mo, or an alloy of Ti, Mo, Au, Pt, Al, Ni, Cu, Cr, TiAlN, HfAlN, or InAlO.

In embodiments, the channel layer 109 may be a n-type doped channel or a p-type doped channel. The channel layer 109 may include a material such as: $CuS_2$, $CuSe_2$, $WSe_2$, $MoS_2$, $MoSe_2$, $WS_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, or a group-VI transition metal dichalcogenide.

In embodiments, the substrate 101 may be a silicon substrate, a glass substrate, such as soda lime glass or borosilicate glass, a metal substrate, a plastic substrate, or another suitable substrate. Other dielectric layer or other devices may be formed on the substrate 101, not shown for clarity.

In embodiments, the ILD layer 103 or the ILD layer 125 may include silicon dioxide ($SiO_2$), carbon doped oxide (CDO), silicon nitride, $O_3$-tetraethylorthosilicate (TEOS), $O_3$-hexamethyldisiloxane (HMDS), plasma-TEOS oxide layer, perfluorocyclobutane, polytetrafluoroethylene, fluorosilicate glass (FSG), organic polymer, silsesquioxane, siloxane, organosilicate glass, or other suitable materials.

In embodiments, the gate dielectric layer 107 may include a high-K dielectric material selected from the group consisting of hafnium silicate, zirconium silicate, hafnium dioxide, zirconium dioxide, aluminum oxide, and nitride hafnium silicate.

FIG. 1(b) schematically illustrates the memory cell 104 including the TFT 140 and the capacitor 150 with the shared contact electrode 143. The memory cell 104 includes a substrate 131, an ILD layer 133 above the substrate 131, and an ILD layer 155 above the ILD layer 133. The capacitor 150 and the TFT 140 above the capacitor 150 are formed within the ILD layer 155. The shared contact electrode 143 may be a drain electrode of the TFT 140 as well as a plate of the capacitor 150. The TFT 140 and the capacitor 150 are self-aligned that a shadow of the TFT 140 substantially overlaps with the capacitor 150.

In embodiments, the capacitor 120 includes a first plate 145, and the shared contact electrode 143 above the first plate 145 and separated from the first plate 145 by a capacitor dielectric layer 144. The capacitor dielectric layer 144, the first plate 145, and the shared contact electrode 143 may be of a rectangular shape in parallel to each other.

In embodiments, the TFT 140 includes a gate electrode 135, a channel layer 139 including a channel material, where the channel layer 139 is separated from the gate electrode 135 by a gate dielectric layer 137. The channel layer 139 is in contact with the shared contact electrode 143. The TFT 140 further includes a source electrode 141 above the channel layer 139, separated from the gate electrode 135 by the gate dielectric layer 137, and in contact with the channel layer 139. A passivation layer 138 is around the channel layer 139 and the shared contact electrode 143. In embodiments, the substrate 131 may be oriented in a horizontal direction. The gate electrode 135 may be above the substrate 131, oriented in a vertical direction substantially orthogonal to the horizontal direction.

In embodiments, the gate dielectric layer 137 includes a gate dielectric material, and is oriented in the vertical direction, around the gate electrode 135, and above the substrate 131. The gate dielectric layer 137 may be completely around the gate electrode 135 as shown in FIG. 1(a), or partially around the gate electrode 135. A spacer 134 may be placed around the sidewall of the gate electrode 135 not conformally covered by the gate dielectric layer 137.

In embodiments, the source electrode 141 is coupled to a metal electrode 151, the first plate 145 of the capacitor 150 is coupled to a metal electrode 153 by a short via 147 within or through an etching stop layer. Similarly, the source electrode 141 may be coupled to the metal electrode 151 by a short via, not shown. The metal electrode 151 is located in a first metal layer 152, the metal electrode 153 is located in a second metal layer 154, and the second metal layer 154 is separated from the first metal layer 152 by the ILD layer 155. In embodiments, the memory cell 104 may be a memory cell of a memory array. The gate electrode 135 may be coupled to a word line of a memory array, the first plate 145 of the capacitor 150 may be coupled to a bit line of the memory array, and the source electrode 141 may be coupled to a source line of the memory array.

Figure 2:
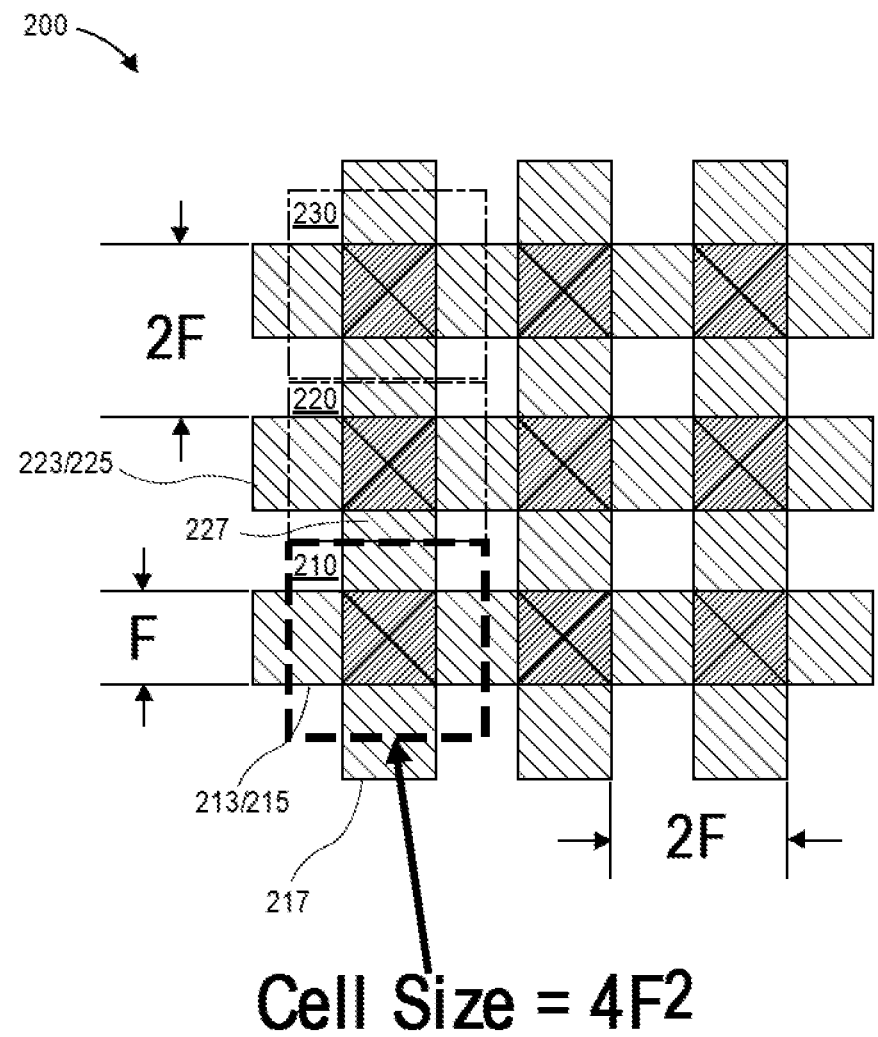
FIG. 2 schematically illustrates a diagram of a semiconductor device including multiple memory cells including a TFT and a capacitor with a shared contact electrode, in accordance with some embodiments.

FIG. 2 schematically illustrates a diagram of a semiconductor device 200 including multiple memory cells, e.g., a memory cell 210, a memory cell 220, a memory cell 230, including a TFT and a capacitor with a shared contact electrode, in accordance with some embodiments. In embodiments, the memory cell 210, the memory cell 220, or the memory cell 230 may be examples of the memory cell 102 or the memory cell 104, as shown in FIGS. 1(a)-1(b).

In embodiments, the memory cell 210 may include a TFT including metal contacts as a source electrode 213, a drain electrode that may be shared with a capacitor, and a plate 215 of the capacitor, and a gate electrode 217. The source electrode 213 and the plate 215 may be along a first direction in parallel with each other, and located in a first metal layer and a second metal layer. The gate electrode 217 may be along a second direction substantially perpendicular or orthogonal to the first direction, and located in a third metal layer between the first metal layer and the second metal layer.

In embodiments, the memory cell 220 may include a TFT including metal contacts as a source electrode 223, a drain electrode that may be shared with a capacitor, and a plate 225 of the capacitor, and a gate electrode 227. The source electrode 223 and the plate 225 may be along a first direction in parallel with each other, and located in a first metal layer and a second metal layer. The gate electrode 227 may be along a second direction substantially perpendicular or orthogonal to the first direction, and located in a third metal layer between the first metal layer and the second metal layer.

In embodiments, the source electrode 213, the plate 215, the gate electrode 217, the source electrode 223, the plate 225, and the gate electrode 227 may have a width equal to a minimal feature width F for the semiconductor device 200.

In addition, the gap between the source electrode 213 and the source electrode 223 may also be equal to a minimal feature width F. Accordingly, the memory cell 210 may occupy an area of $2F*2F=4F^2$. Other memory cells, e.g., the memory cell 220 or the memory cell 230 may occupy similar areas.

Figure 3:
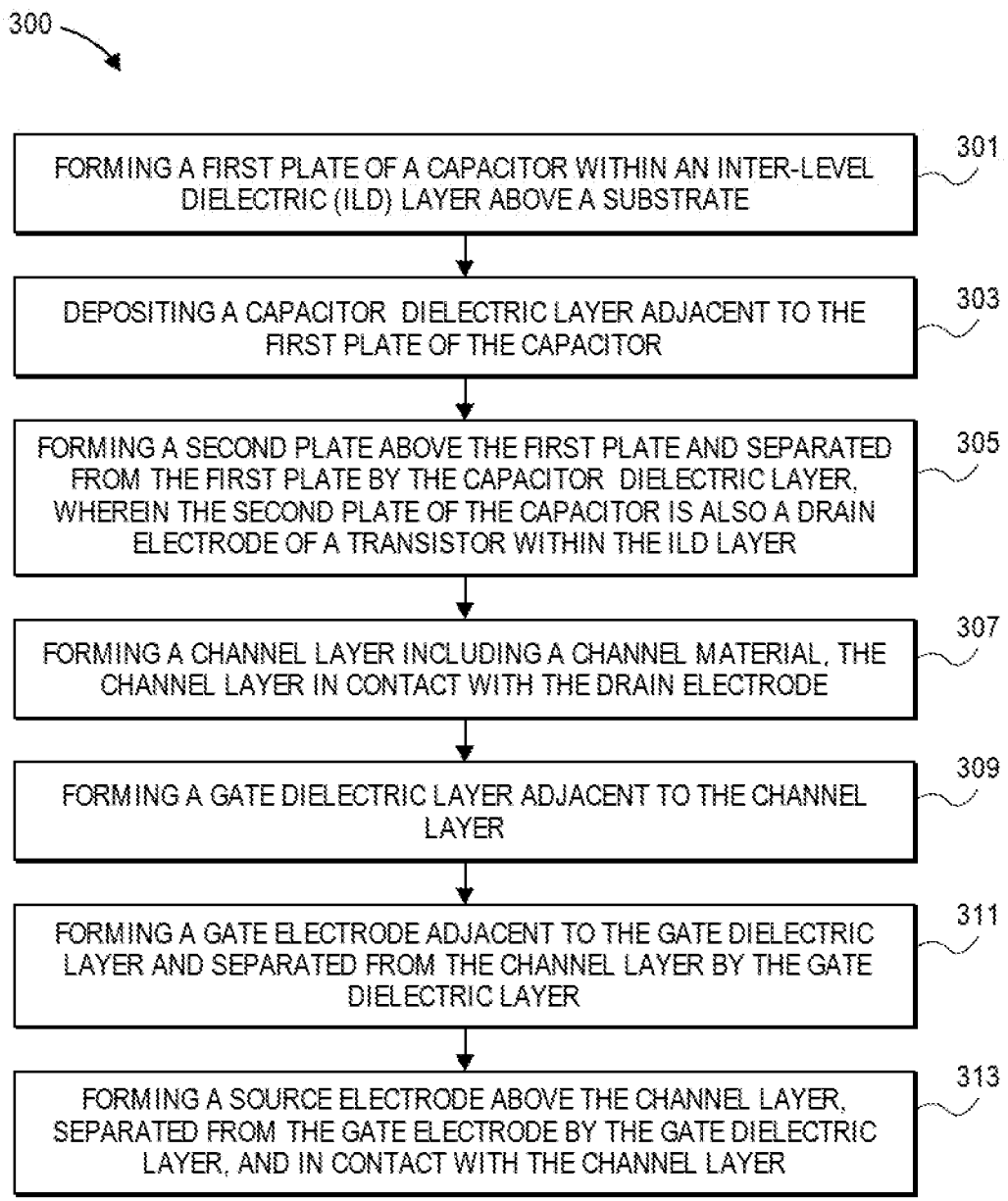
FIG. 3 illustrates a process for forming a memory cell including a TFT and a capacitor with a shared contact electrode, in accordance with some embodiments.

FIG. 3 illustrates a process 300 for forming a memory cell including a TFT and a capacitor with a shared contact electrode, in accordance with some embodiments. In embodiments, the process 300 may be applied to form the memory cell 102, or the memory cell 104, as shown in FIGS. 1(a)-1(b); or the memory cell 210, the memory cell 220, or the memory cell 230, as shown in FIG. 2.

At block 301, the process 300 may include forming a first plate of a capacitor within an ILD layer above a substrate. For example, the process 300 may include forming the first plate 115 of the capacitor 120 within the ILD layer 125 above the substrate 101 as shown in FIG. 1(a).

At block 303, the process 300 may include depositing a capacitor dielectric layer adjacent to the first plate of the capacitor. For example, the process 300 may include depositing the capacitor dielectric layer 114 adjacent to the first plate 115 of the capacitor 120 as shown in FIG. 1(a).

At block 305, the process 300 may include forming a second plate above the first plate and separated from the first plate by the capacitor dielectric layer, wherein the second plate of the capacitor is also a drain electrode of a transistor within the ILD layer. For example, the process 300 may include forming the second plate 113 above the first plate 115 and separated from the first plate 115 by the capacitor dielectric layer 114, where the second plate 113 of the capacitor 120 is also a drain electrode of the TFT 110 within the ILD layer 125 as shown in FIG. 1(a).

At block 307, the process 300 may include forming a channel layer including a channel material, the channel layer in contact with the drain electrode. For example, the process 300 may include forming the channel layer 109 including a channel material, the channel layer 109 in contact with the drain electrode, which is also the second plate 113 as shown in FIG. 1(a).

At block 309, the process 300 may include forming a gate dielectric layer adjacent to the channel layer. For example, the process 300 may include forming the gate dielectric layer 107 adjacent to the channel layer 109 as shown in FIG. 1(a).

At block 311, the process 300 may include forming a gate electrode adjacent to the gate dielectric layer and separated from the channel layer by the gate dielectric layer. For example, the process 300 may include forming the gate electrode 105 adjacent to the gate dielectric layer 107 and separated from the channel layer 109 by the gate dielectric layer 107 as shown in FIG. 1(a).

At block 313, the process 300 may include forming a source electrode above the channel layer, separated from the gate electrode by the gate dielectric layer, and in contact with the channel layer. For example, the process 300 may include forming the source electrode 111 above the channel layer 109, separated from the gate electrode 105 by the gate dielectric layer 107, and in contact with the channel layer 109 as shown in FIG. 1(a).

In addition, the process 300 may include additional operations to form other layers, e.g., ILD layers, encapsulation layers, insulation layers, not shown.

Figure 4:
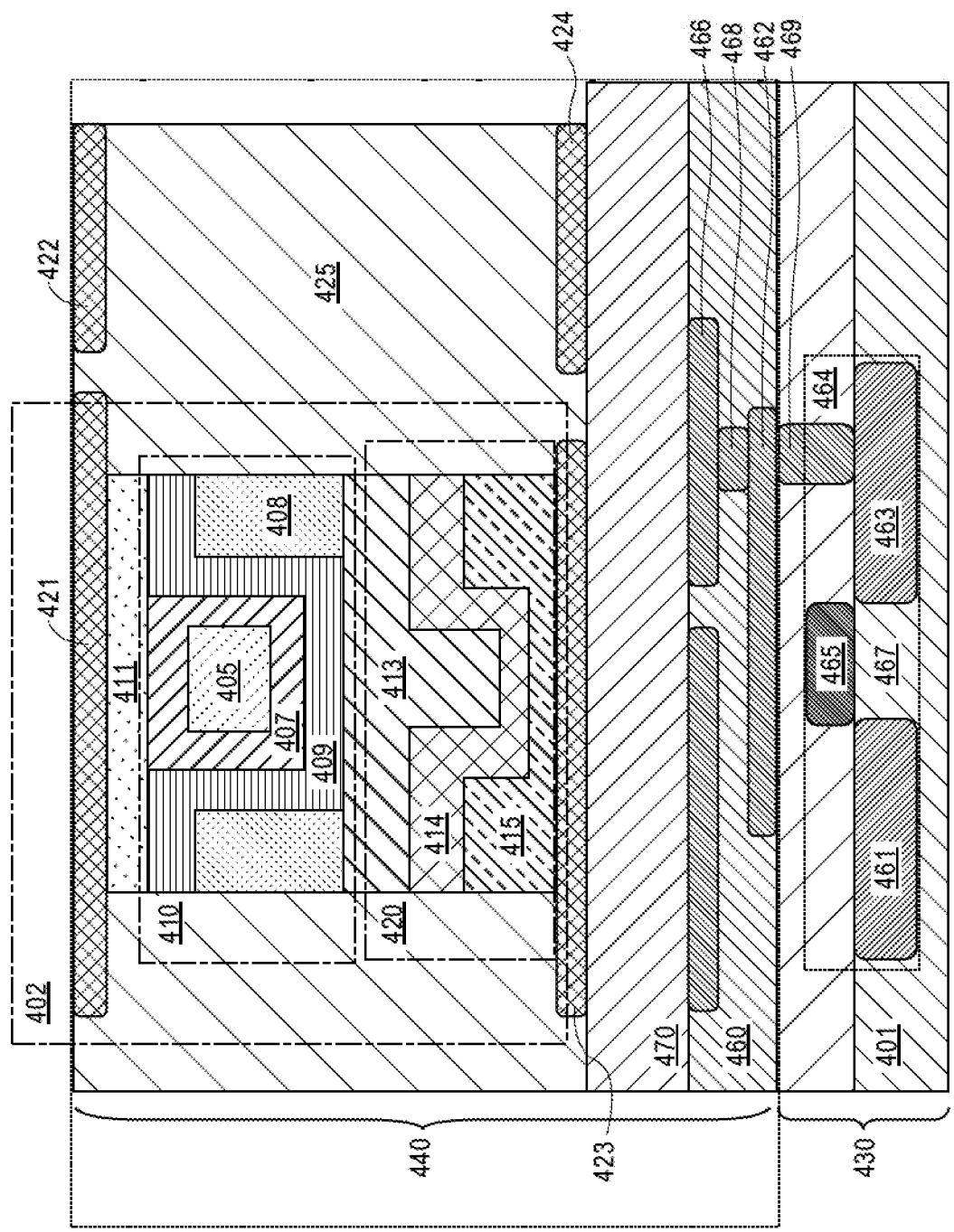
FIG. 4 schematically illustrates a diagram of a memory cell including a TFT and a capacitor with a shared contact electrode and formed in back-end-of-line (BEOL) on a substrate, in accordance with some embodiments.

FIG. 4 schematically illustrates a diagram of a memory cell 402 including a TFT 410 and a capacitor 420 with a shared contact electrode 413 and formed in back-end-of-line (BEOL) on a substrate 401, in accordance with some embodiments. The memory cell 402 may be an example of the memory cell 102, or the memory cell 104, as shown in FIGS. 1(a)-1(b); or the memory cell 210, the memory cell 220, or the memory cell 230, as shown in FIG. 2. Various layers in the memory cell 402 may be similar to corresponding layers in the memory cell 102, the memory cell 104, or other memory cells.

In embodiments, the memory cell 402 is formed above the substrate 401 within the ILD layer 425, including the TFT 410 and the capacitor 420 with the shared contact electrode 413. The shared contact electrode 413 may be a drain electrode of the TFT 410 as well as a plate of the capacitor 420. The TFT 410 and the capacitor 420 are self-aligned that a shadow of the TFT 410 substantially overlaps with the capacitor 420.

In embodiments, the capacitor 420 includes a first plate 415, and the shared contact electrode 413 above the first plate 415 and separated from the first plate 415 by a capacitor dielectric layer 414. The capacitor dielectric layer 414, the first plate 415, and the shared contact electrode 413 may be of a rectangular shape in parallel to each other, or may contain a U-shaped portion.

In embodiments, the TFT 410 includes a gate electrode 405, a channel layer 409 including a channel material, where the channel layer 409 is separated from the gate electrode 405 by a gate dielectric layer 407. The channel layer 409 is in contact with the shared contact electrode 413. The TFT 410 further includes a source electrode 411 above the channel layer 409, separated from the gate electrode 405 by the gate dielectric layer 407, and in contact with the channel layer 409. A passivation layer 408 is around the channel layer 409 and the shared contact electrode 413. In embodiments, the substrate 401 may be oriented in a horizontal direction. The gate electrode 405 may be above the substrate 401, oriented in a vertical direction substantially orthogonal to the horizontal direction.

In embodiments, the gate dielectric layer 407 includes a gate dielectric material, and is oriented in the vertical direction, around the gate electrode 405, and above the substrate 401. The gate dielectric layer 407 may be completely around the gate electrode 405. The source electrode 411 is coupled to a metal electrode 421, the first plate 415 of the capacitor 420 is coupled to a metal electrode 423. The metal electrode 421 is located in a first metal layer 422, the metal electrode 423 is located in a second metal layer 424, and the second metal layer 424 is separated from the first metal layer 422 by the ILD layer 425. In embodiments, the memory cell 402 may be a memory cell of a memory array. The gate electrode 405 may be coupled to a word line of a memory array, the first plate 415 of the capacitor 420 may be coupled to a bit line of the memory array, and the source electrode 411 may be coupled to a source line of the memory array.

In embodiments, the memory cell 402 may be formed at the BEOL 440. In addition to the memory cell 402, the BEOL 440 may further include a dielectric layer 460 and a dielectric layer 470. One or more vias, e.g., a via 468, may be connected to one or more interconnect, e.g., an interconnect 466, and an interconnect 462 within the dielectric layer 460. In embodiments, the interconnect 466 and the interconnect 462 may be of different metal layers at the BEOL 440. The dielectric layer 460 is shown for example only. Although not shown by FIG. 4, in various embodiments there may be multiple dielectric layers included in the BEOL 440.

In embodiments, the BEOL 440 may be formed on the front-end-of-line (FEOL) 430. The FEOL 430 may include the substrate 401. In addition, the FEOL 430 may include other devices, e.g., a transistor 464. In embodiments, the transistor 464 may be a FEOL transistor, including a source 461, a drain 463, and a gate 465, with a channel 467 between the source 461 and the drain 463 under the gate 465. Furthermore, the transistor 464 may be coupled to interconnects, e.g., the interconnect 462, through a via 469.

Figure 5:
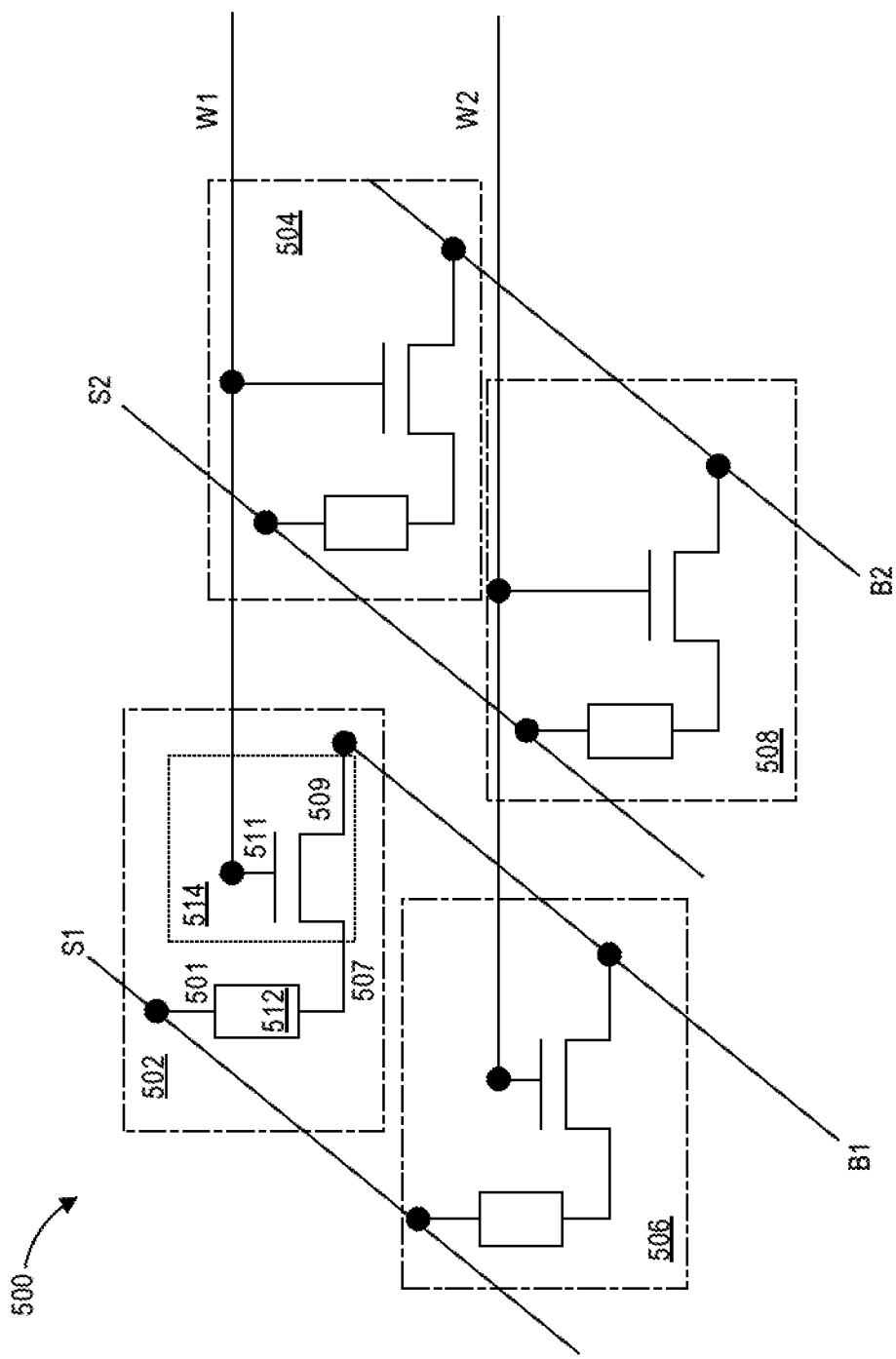
FIG. 5 schematically illustrates a memory array with multiple memory cells including a TFT and a capacitor with a shared contact electrode, in accordance with some embodiments.

FIG. 5 schematically illustrates a memory array 500 with multiple memory cells (e.g., a memory cell 502, a memory cell 504, a memory cell 506, and a memory cell 508), where a TFT, e.g., a TFT 514, may be a selector of a memory cell, e.g., the memory cell 502, in accordance with various embodiments. In embodiments, the memory cell 502, or other memory cells may be an example of the memory cell 102, or the memory cell 104, as shown in FIGS. 1(a)-1(b); or the memory cell 210, the memory cell 220, or the memory cell 230, as shown in FIG. 2, the memory cell 402 as shown in FIG. 4, or a memory cell formed according to the process 300 as shown in FIG. 3.

In embodiments, the multiple memory cells may be arranged in a number of rows and columns coupled by bit lines, e.g., bit line B1 and bit line B2, word lines, e.g., word line W1 and word line W2, and source lines, e.g., source line Si and source line S2. The memory cell 502 may be coupled in series with the other memory cells of the same row, and may be coupled in parallel with the memory cells of the other rows. The memory array 500 may include any suitable number of one or more memory cells.

In embodiments, multiple memory cells, such as the memory cell 502, the memory cell 504, the memory cell 506, and the memory cell 508, may have a similar configuration. For example, the memory cell 502 may include the TFT 514 coupled to a storage cell 512 that may be a capacitor, which may be called a 1T1C configuration. The memory cell 502 may be controlled through multiple electrical connections to read from the memory cell, write to the memory cell, and/or perform other memory operations.

The TFT 514 may be a selector for the memory cell 502. A word line W1 of the memory array 500 may be coupled to a gate electrode 511 of the TFT 514. When the word line W1 is active, the TFT 514 may select the storage cell 512. A bit line B1 of the memory array 500 may be coupled to an electrode 501 of the storage cell 512, while another electrode 507 of the storage cell 512 may be shared with the TFT 514. In addition, a source line Si of the memory array 500 may be coupled to another electrode, e.g., an electrode 509 of the TFT 514. The shared electrode 507 may be a drain electrode of the TFT 514, while the electrode 509 may be a source electrode of the TFT 514. A drain electrode and a source electrode may be used interchangeably herein. Additionally, a source line and a bit line may be used interchangeably herein.

In various embodiments, the memory cells and the transistors, e.g., the memory cell 502 and the TFT 514, included in the memory array 500 may be formed in BEOL, as shown in FIG. 4. For example, the TFT 514 may be illustrated as the TFT 410 shown in FIG. 4 at the BEOL, and the storage cell 512 may be the capacitor 420 shown in FIG. 4. Accordingly, the memory array 500 may be formed in higher metal layers, e.g., metal layer 3 and/or metal layer 4, of the integrated circuit above the active substrate region, and may not occupy the active substrate area that is occupied by conventional transistors or memory devices.

Figure 6:
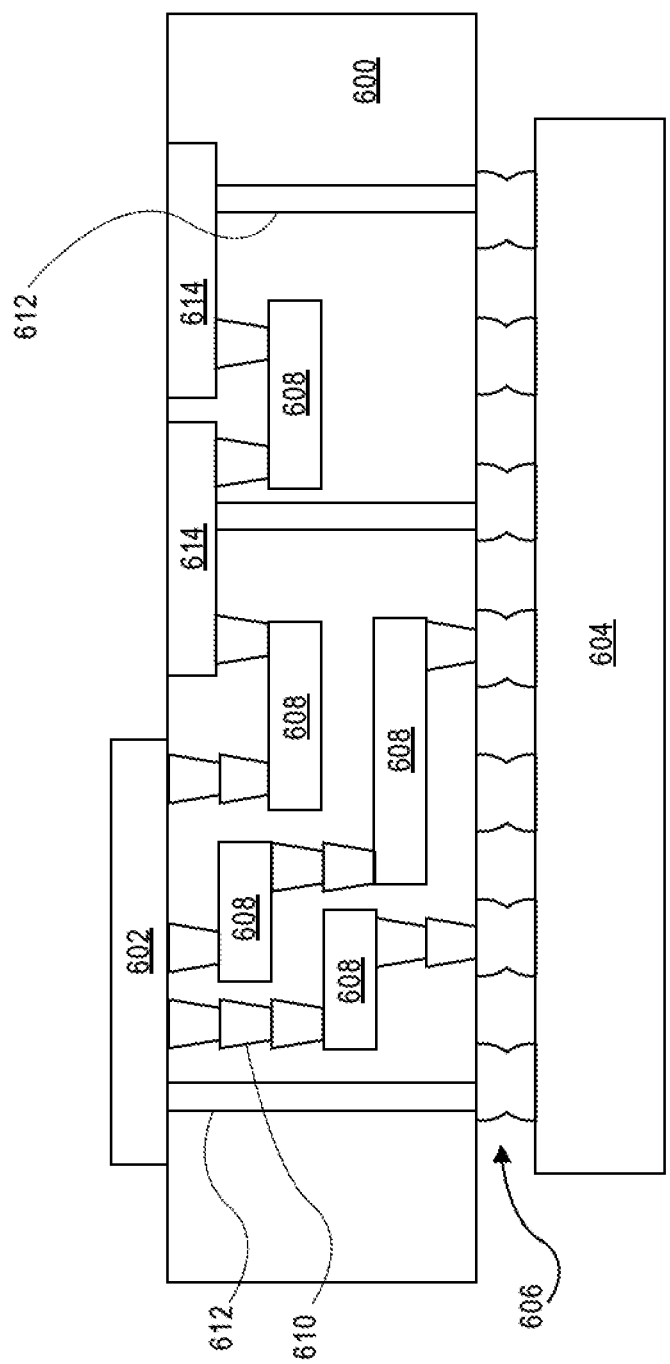
FIG. 6 schematically illustrates an interposer implementing one or more embodiments of the disclosure, in accordance with some embodiments.

FIG. 6 illustrates an interposer 600 that includes one or more embodiments of the disclosure. The interposer 600 is an intervening substrate used to bridge a first substrate 602 to a second substrate 604. The first substrate 602 may be, for instance, a substrate support for a memory cell, e.g., the memory cell 102, or the memory cell 104, as shown in FIGS. 1(a)-1(b); or the memory cell 210, the memory cell 220, or the memory cell 230, as shown in FIG. 2, the memory cell 402 as shown in FIG. 4, or a memory cell formed according to the process 300 as shown in FIG. 3. The second substrate 604 may be, for instance, a memory module, a computer motherboard, or another integrated circuit die. For example, the second substrate 604 may be a memory module including the memory array 500 as shown in FIG. 5. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the disclosure, apparatuses or processes disclosed herein may be used in the fabrication of interposer 600.

Figure 7:
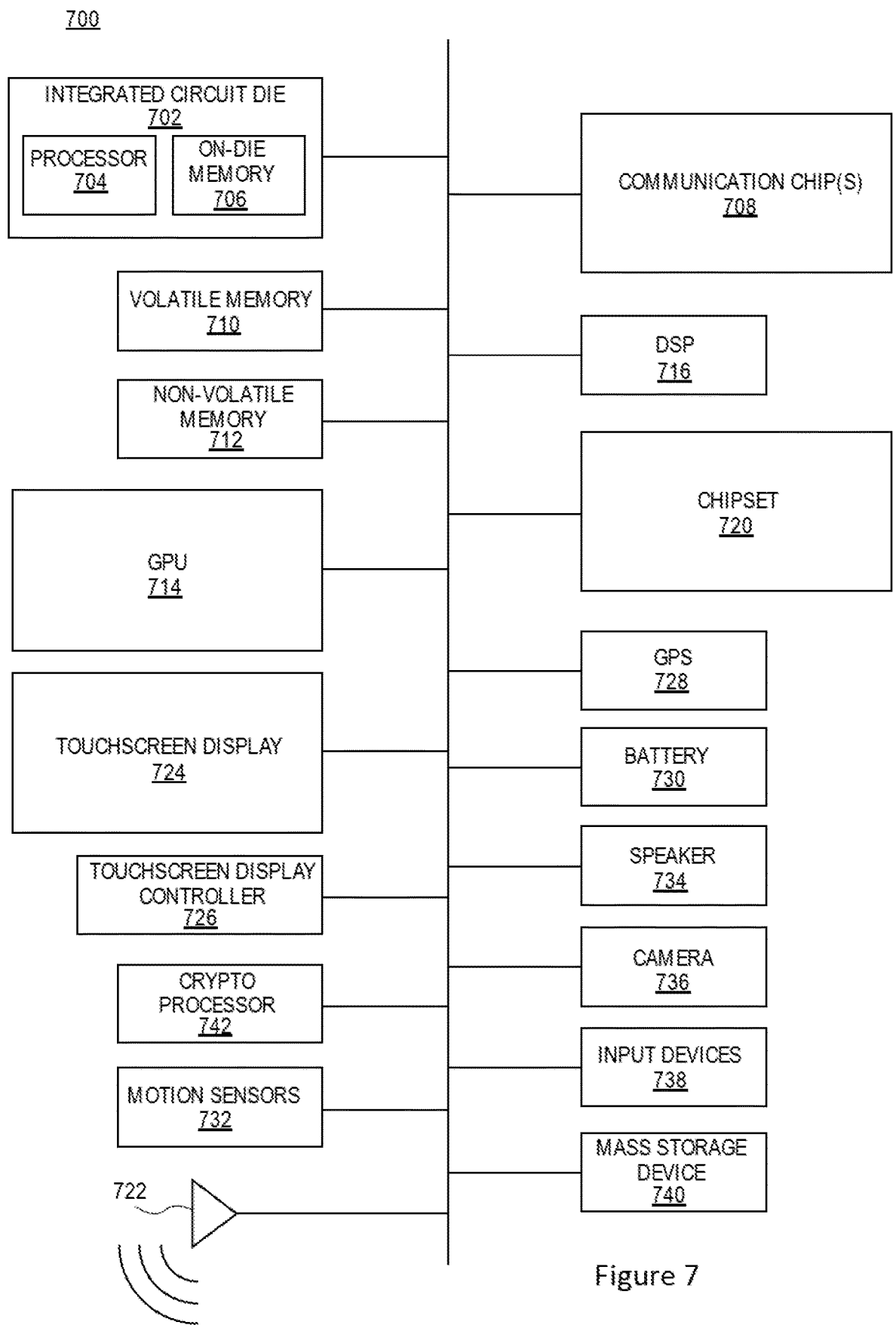
FIG. 7 schematically illustrates a computing device built in accordance with an embodiment of the disclosure, in accordance with some embodiments.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a processor 704 as well as on-die memory 706, often used as cache memory, which can be provided by technologies such as embedded DRAM (eDRAM), or SRAM. For example, the on-die memory 706 may include the memory cell 102, or the memory cell 104, as shown in FIGS. 1(a)-1(b); or the memory cell 210, the memory cell 220, or the memory cell 230, as shown in FIG. 2, the memory cell 402 as shown in FIG. 4, or a memory cell formed according to the process 300 as shown in FIG. 3.

In embodiments, the computing device 700 may include a display or a touchscreen display 724, and a touchscreen display controller 726. A display or the touchscreen display 724 may include a FPD, an AMOLED display, a TFT LCD, a micro light-emitting diode (µLED) display, or others.

Computing device 700 may include other components that may or may not be physically and electrically coupled to the motherboard or fabricated within a SoC die. These other components include, but are not limited to, volatile memory 710 (e.g., dynamic random access memory (DRAM), non-volatile memory 712 (e.g., ROM or flash memory), a graphics processing unit 714 (GPU), a digital signal processor (DSP) 716, a crypto processor 742 (e.g., a specialized processor that executes cryptographic algorithms within hardware), a chipset 720, at least one antenna 722 (in some implementations two or more antenna may be used), a battery 730 or other power source, a power amplifier (not shown), a voltage regulator (not shown), a global positioning system (GPS) device 728, a compass, a motion coprocessor or sensors 732 (that may include an accelerometer, a gyroscope, and a compass), a microphone (not shown), a speaker 734, a camera 736, user input devices 738 (such as a keyboard, mouse, stylus, and touchpad), and a mass storage device 740 (such as hard disk drive, compact disk (CD), digital versatile disk (DVD), and so forth). The computing device 700 may incorporate further transmission, telecommunication, or radio functionality not already described herein. In some implementations, the computing device 700 includes a radio that is used to communicate over a distance by modulating and radiating electromagnetic waves in air or space. In further implementations, the computing device 700 includes a transmitter and a receiver (or a transceiver) that is used to communicate over a distance by modulating and radiating electromagnetic waves in air or space.

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi, NFC, and Bluetooth and a second communications logic unit 708 may be dedicated to longer range wireless communications such as GPS, EDGE, GPRS, CDMA, WiMAX, LTE, Ev-DO, and others.

The processor 704 of the computing device 700 includes one or more devices, such as transistors. The term "processor" may refer to any device or portion of a device that processes electronic data from registers and/or memory to transform that electronic data into other electronic data that may be stored in registers and/or memory. The communications logic unit 708 may also include one or more devices, such as transistors.

In further embodiments, another component housed within the computing device 700 may contain one or more devices, such as DRAM, that are formed in accordance with implementations of the current disclosure, e.g., the memory cell 102, or the memory cell 104, as shown in FIGS. 1(*a*)-1(*b*); or the memory cell 210, the memory cell 220, or the memory cell 230, as shown in FIG. 2, the memory cell 402 as shown in FIG. 4, or a memory cell formed according to the process 300 as shown in FIG. 3.

In various embodiments, the computing device 700 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some Non-Limiting Examples are Provided Below.

Example 1 may include a semiconductor device, comprising: a substrate; an inter-level dielectric (ILD) layer above the substrate; a capacitor within the ILD layer, wherein the capacitor includes a first plate above the substrate, and a shared contact electrode above the first plate and separated from the first plate by a capacitor dielectric layer, wherein the shared contact electrode acts as a second plate for the capacitor, and as a drain electrode of a transistor; the transistor within the ILD layer and above the capacitor, including: a gate electrode above the substrate and above the capacitor; a channel layer including a channel material, separated from the gate electrode by a gate dielectric layer, and in contact with the shared contact electrode; and a source electrode above the channel layer, separated from the gate electrode by the gate dielectric layer, and in contact with the channel layer.

Example 2 may include the semiconductor device of example 1 and/or some other examples herein, wherein the transistor and the capacitor are self-aligned that a shadow of the transistor substantially overlaps with the capacitor.

Example 3 may include the semiconductor device of example 1 and/or some other examples herein, wherein the source electrode above the channel layer is further separated from the gate electrode by a spacer and the gate dielectric layer.

Example 4 may include the semiconductor device of example 1 and/or some other examples herein, wherein the transistor further includes: the gate dielectric layer between the gate electrode and the channel layer.

Example 5 may include the semiconductor device of example 1 and/or some other examples herein, wherein the capacitor dielectric layer of the capacitor includes a U-shaped portion.

Example 6 may include the semiconductor device of example 1 and/or some other examples herein, wherein the substrate is below the gate electrode in a horizontal direction, and the gate electrode is oriented in a vertical direction substantially orthogonal to the horizontal direction.

Example 7 may include the semiconductor device of example 1 and/or some other examples herein, wherein the first plate of the capacitor is coupled to a first metal electrode located in a first metal layer, the source electrode is coupled to a second metal electrode located in a second metal layer, and the ILD layer is between the first metal layer and the second metal layer.

Example 8 may include the semiconductor device of example 7 and/or some other examples herein, wherein the first plate of the capacitor is coupled by a first short via to the first metal electrode located in the first metal layer, or the source electrode is coupled by a second short via to the second metal electrode located in the second metal layer.

Example 9 may include the semiconductor device of example 7 and/or some other examples herein, wherein the gate electrode is coupled to a word line of a memory array, the first plate of the capacitor is coupled to a bit line of the memory array, and the source electrode is coupled to a source line of the memory array.

Example 10 may include the semiconductor device of example 1 and/or some other examples herein, wherein the transistor and the capacitor are within an interconnect structure that is above the substrate.

Example 11 may include the semiconductor device of example 1 and/or some other examples herein, wherein the substrate includes a material selected from the group consisting of a silicon substrate, a glass substrate, a metal substrate, and a plastic substrate.

Example 12 may include the semiconductor device of example 1 and/or some other examples herein, wherein the ILD layer includes a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

Example 13 may include the semiconductor device of example 1 and/or some other examples herein, wherein the gate electrode, the source electrode, the shared contact electrode, or the first plate includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

Example 14 may include the semiconductor device of example 1 and/or some other examples herein, wherein the channel layer includes a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Example 15 may include the semiconductor device of example 1 and/or some other examples herein, wherein gate dielectric layer includes a high-K dielectric material selected from the group consisting of hafnium silicate, zirconium silicate, hafnium dioxide, zirconium dioxide, aluminum oxide, and nitride hafnium silicate.

Example 16 may include a method for forming a semiconductor device, the method comprising: forming a first plate of a capacitor within an inter-level dielectric (ILD) layer above a substrate; depositing a capacitor dielectric layer adjacent to the first plate of the capacitor; forming a shared contact electrode above the first plate and separated from the first plate by the capacitor dielectric layer, wherein the shared contact electrode acts as a second plate for the capacitor, and as a drain electrode of a transistor within the ILD layer; forming a channel layer including a channel material, the channel layer in contact with the shared contact electrode; forming a gate dielectric layer adjacent to the channel layer; forming a gate electrode adjacent to the gate dielectric layer and separated from the channel layer by the gate dielectric layer; and forming a source electrode above the channel layer, separated from the gate electrode by the gate dielectric layer, and in contact with the channel layer.

Example 17 may include the method of example 16 and/or some other examples herein, wherein the transistor and the capacitor are self-aligned that a shadow of the transistor substantially overlaps with the capacitor.

Example 18 may include the method of example 16 and/or some other examples herein, further comprising: forming a spacer to separate the channel layer from the gate electrode.

Example 19 may include the method of example 16 and/or some other examples herein, wherein the capacitor dielectric layer of the capacitor includes a U-shaped portion.

Example 20 may include the method of example 16 and/or some other examples herein, wherein the first plate of the capacitor is coupled to a first metal electrode located in a first metal layer, the source electrode is coupled to a second metal electrode located in a second metal layer, and the ILD layer is between the first metal layer and the second metal layer.

Example 21 may include the method of example 16 and/or some other examples herein, wherein the substrate is below the gate electrode in a horizontal direction, and the gate electrode is oriented in a vertical direction substantially orthogonal to the horizontal direction.

Example 22 may include a computing device, comprising: a circuit board; and a memory device coupled to the circuit board and including a memory array, wherein the memory array includes a plurality of memory cells, a memory cell of the plurality of memory cells includes a transistor and a capacitor, wherein the capacitor includes: a first plate above a substrate, and coupled to a bit line of the memory array; and a second plate above the first plate and separated from the first plate by a capacitor dielectric layer, wherein the second plate is also a drain electrode of the transistor; and wherein the transistor includes: a channel layer including a channel material, the channel layer in contact with the drain electrode of the transistor; a gate electrode separated from the channel layer by a gate dielectric layer, the gate electrode coupled to a word line of the memory array; and a source electrode separated from the gate electrode by the gate dielectric layer, in contact with the channel layer, and coupled to a source line of the memory array.

Example 23 may include computing device of example 22 and/or some other examples herein, wherein the transistor and the capacitor are self-aligned that a shadow of the transistor substantially overlaps with the capacitor.

Example 24 may include computing device of example 22 and/or some other examples herein, wherein the source electrode is further separated from the gate electrode by a spacer and the gate dielectric layer.

Example 25 may include computing device of example 22 and/or some other examples herein, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a substrate;
   an inter-level dielectric (ILD) layer above the substrate;
   a capacitor within the ILD layer, wherein the capacitor includes a first plate above the substrate, and a shared contact electrode above the first plate and separated from the first plate by a capacitor dielectric layer, wherein the shared contact electrode acts as a second plate for the capacitor, and as a drain electrode of a transistor;
   the transistor within the ILD layer and above the capacitor, including:
      a gate electrode above the substrate and above the capacitor;
      a channel layer including a channel material, separated from the gate electrode by a gate dielectric layer, and in contact with the shared contact electrode; and
      a source electrode above the channel layer, separated from the gate electrode by the gate dielectric layer, and in contact with the channel layer.

2. The semiconductor device of claim 1, wherein the transistor and the capacitor are self-aligned that a shadow of the transistor substantially overlaps with the capacitor.

3. The semiconductor device of claim 1, wherein the source electrode above the channel layer is further separated from the gate electrode by a spacer and the gate dielectric layer.

4. The semiconductor device of claim 1, wherein the transistor further includes:
the gate dielectric layer between the gate electrode and the channel layer.

5. The semiconductor device of claim 1, wherein the capacitor dielectric layer of the capacitor includes a U-shaped portion.

6. The semiconductor device of claim 1, wherein the substrate is below the gate electrode in a horizontal direction, and the gate electrode is oriented in a vertical direction substantially orthogonal to the horizontal direction.

7. The semiconductor device of claim 1, wherein the first plate of the capacitor is coupled to a first metal electrode located in a first metal layer, the source electrode is coupled to a second metal electrode located in a second metal layer, and the ILD layer is between the first metal layer and the second metal layer.

8. The semiconductor device of claim 7, wherein the first plate of the capacitor is coupled by a first short via to the first metal electrode located in the first metal layer, or the source electrode is coupled by a second short via to the second metal electrode located in the second metal layer.

9. The semiconductor device of claim 7, wherein the gate electrode is coupled to a word line of a memory array, the first plate of the capacitor is coupled to a bit line of the memory array, and the source electrode is coupled to a source line of the memory array.

10. The semiconductor device of claim 1, wherein the transistor and the capacitor are within an interconnect structure that is above the substrate.

11. The semiconductor device of claim 1, wherein the substrate includes a material selected from the group consisting of a silicon substrate, a glass substrate, a metal substrate, and a plastic substrate.

12. The semiconductor device of claim 1, wherein the ILD layer includes a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

13. The semiconductor device of claim 1, wherein the gate electrode, the source electrode, the shared contact electrode, or the first plate includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

14. The semiconductor device of claim 1, wherein the channel layer includes a material selected from the group consisting of $CuS_2$, $CuSe_2$, $WSe_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

15. The semiconductor device of claim 1, wherein gate dielectric layer includes a high-K dielectric material selected from the group consisting of hafnium silicate, zirconium silicate, hafnium dioxide, zirconium dioxide, aluminum oxide, and nitride hafnium silicate.

16. A computing device, comprising:
a circuit board; and
a memory device coupled to the circuit board and including a memory array, wherein the memory array includes a plurality of memory cells, a memory cell of the plurality of memory cells includes a transistor and a capacitor,
wherein the capacitor includes:
a first plate above a substrate, and coupled to a bit line of the memory array; and
a second plate above the first plate and separated from the first plate by a capacitor dielectric layer, wherein the second plate is also a drain electrode of the transistor; and wherein the transistor includes:
a channel layer including a channel material, the channel layer in contact with the drain electrode of the transistor;
a gate electrode separated from the channel layer by a gate dielectric layer, the gate electrode coupled to a word line of the memory array; and
a source electrode separated from the gate electrode by the gate dielectric layer, in contact with the channel layer, and coupled to a source line of the memory array.

17. The computing device of claim 16, wherein the transistor and the capacitor are self-aligned that a shadow of the transistor substantially overlaps with the capacitor.

18. The computing device of claim 16, wherein the source electrode is further separated from the gate electrode by a spacer and the gate dielectric layer.

19. The computing device of claim 16, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

* * * * *